United States Patent
Basheer et al.

(10) Patent No.: US 6,849,195 B2
(45) Date of Patent: Feb. 1, 2005

(54) COMPOSITES WITH LARGE MAGNETOSTRICTION

(75) Inventors: Rafil A. Basheer, Rochester Hills, MI (US); Donald T. Morelli, White Lake, MI (US)

(73) Assignee: Delphi Technologies, Inc., Troy, MI (US)

( * ) Notice: Subject to any disclaimer, the term of this patent is extended or adjusted under 35 U.S.C. 154(b) by 0 days.

(21) Appl. No.: 10/406,016

(22) Filed: Apr. 3, 2003

(65) Prior Publication Data

US 2004/0195541 A1 Oct. 7, 2004

(51) Int. Cl.[7] .............................. H01F 1/00
(52) U.S. Cl. .................... 252/62.54; 252/62.55
(58) Field of Search ................. 252/62.54, 62.55

(56) References Cited

U.S. PATENT DOCUMENTS

| | | | |
|---|---|---|---|
| 3,878,147 A | * 4/1975 | Craven | 523/150 |
| 4,040,971 A | * 8/1977 | Simmonds | 252/62.54 |
| 4,378,258 A | * 3/1983 | Clark et al. | 148/100 |
| 5,792,284 A | 8/1998 | Cedell et al. | 148/301 |
| 5,891,367 A | 4/1999 | Basheer et al. | 252/514 |
| 5,985,049 A | 11/1999 | Pinkerton et al. | 148/301 |
| 5,993,565 A | 11/1999 | Pinkerton et al. | 148/104 |
| 6,465,039 B1 | 10/2002 | Pinkerton et al. | |

FOREIGN PATENT DOCUMENTS

| | | | |
|---|---|---|---|
| EP | 588120 | * | 3/1994 |
| GB | 2128849 | * | 5/1982 |

OTHER PUBLICATIONS

Ce–Wen Nan et al, "microstructural featuers on the effective magnetostriction of composite materials," vol. 60, No. 9, Sep. 1, 1999, pp. 6723–6730.

* cited by examiner

*Primary Examiner*—C. Melissa Koslow
(74) *Attorney, Agent, or Firm*—Jimmy L. Funke

(57) ABSTRACT

A magnetostrictive composite having large magnetostriction by virtue of 2–50 vol. % magnetostrictive particles dispersed throughout a resin matrix formed from a thermosetting resin, an amine curing agent, fumed silica and a flexibilizing agent, wherein the magnetostrictive particles are aligned in the direction of their magnetic easy axes by the presence of a magnetic field prior to or during curing of the resin matrix. In an exemplary embodiment, an epoxy-Terfenol composite is formed by mixing an epoxy resin, fumed silica, a cycloaliphatic amine curing agent, and a flexibilizing agent that is a flexible diepoxide of EEW 390–470 or a mixture of a high molecular weight polyamine of MW 2000–5000 and a low molecular weight polyamine of MW 230–450 with Terfenol particles and curing the mixture in the presence of a magnetic field.

51 Claims, 2 Drawing Sheets

COMPOSITES WITH LARGE MAGNETOSTRICTION

TECHNICAL FIELD

This invention relates to composites of magnetostrictive materials prepared by a method that optimizes the magnetostrictive properties.

BACKGROUND OF THE INVENTION

A magnetostrictive material is a material whose shape changes as a function of applied magnetic field. For example, if a rod of magnetostrictive material of length l is subject to an applied magnetic field H, its length will decrease or increase, with the change in length $\Delta l$ saturating at the value $\Delta l = \lambda_s l$, where $\lambda_s$ is the magnetostrictive coefficient of the material, also referred to as the saturation magnetostriction. A common magnetostrictive material is nickel for which $\lambda_s$ equals about −40 parts per million (ppm) or $-40 \times 10^6$. When a magnetic field is applied to a magnetostrictive material, it will expand or contract, such that a positive $\lambda_s$ refers to expansion and a negative $\lambda_s$ refers to contraction. The material currently having the largest known magnetostrictive coefficient is an alloy of terbium, dysprosium and iron, commonly referred to as Terfenol, which possesses $\lambda_s > 1000$ ppm. This is approximately 100 times larger than nickel. A magnetostrictive coefficient in this range, often referred to as giant magnetostriction, may be useful for many technological applications, such as actuation and sensing. However, the Terfenol alloy is brittle and expensive.

Significant effort has recently been devoted to the fabrication of composites of Terfenol and other materials, including polymers and metals, in an effort to combine the good magnetostrictive properties of Terfenol with a matrix material having more robust mechanical properties. One such effort is disclosed in Pinkerton et al. U.S. Pat. No. 5,993,565, which describes composites of Terfenol with a metal matrix of aluminum, copper, iron, magnesium or nickel. In these composites, the magnetostrictive coefficient $\lambda_s$ is reduced by approximately the volume fraction of the magnetostrictive phase. For example, a composite containing 50% Terfenol would have a magnetostrictive coefficient approximately half that of bulk Terfenol.

Other efforts have recently been directed to composites of Terfenol in an epoxy resin matrix. Highly metal-filled epoxy resins are generally rigid but brittle materials and may be subject to failure even under mild conditions. However, recent theoretical models, such as that disclosed in Nan et al. 60 Physical Review B, 6723 (1999), suggest that the magnetostrictive coefficient $\lambda_s$ a composite, rather than having a directly proportional dependence on magnetostrictive particle content, depends in part on the elastic properties of the matrix material, and in particular, for Terfenol/epoxy composites, large magnetostriction may still be obtained at lower volume filling fractions of Terfenol due to the softness of epoxy. This theoretical work suggests that further investigation into magnetorestrictive composites may yield improved commercial products than those currently available.

There is thus a need to provide a less rigid magnetostrictive composite having large magnetostrictive properties and good mechanical properties, such that the material can be used in aggressive environments, such as automotive applications and the like.

SUMMARY OF THE INVENTION

The present invention provides a magnetostrictive composite having large magnetostriction comprising 2–50 vol. % magnetostrictive particles dispersed throughout a resin matrix formed from a thermosetting epoxy resin, an amine curing agent, fumed silica and a flexibilizing agent wherein the magnetostrictive particles are aligned in the direction of their magnetic easy axes. The particles are aligned by orienting the particles in the presence of a magnetic field prior to or during curing of the resin matrix. In an exemplary embodiment, an epoxy-Terfenol composite is formed by mixing an epoxy resin, fumed silica, a cycloaliphatic amine curing agent, and a flexibilizing agent, with Terfenol particles and curing the mixture in the presence of a magnetic field. Preferably, the flexibilizing agent comprises either a flexible diepoxide, such as diglycidyl ester epoxy resin, having an epoxy equivalent weight (EEW) of 390–470, or a mixture of a high molecular weight polyamine of MW 2000–5000 and a low molecular weight polyamine of MW 230–450.

BRIEF DESCRIPTION OF THE DRAWINGS

The present invention will now be described, by way of example, with reference to the accompanying drawings, in which.

DETAILED DESCRIPTION

Figure 1:
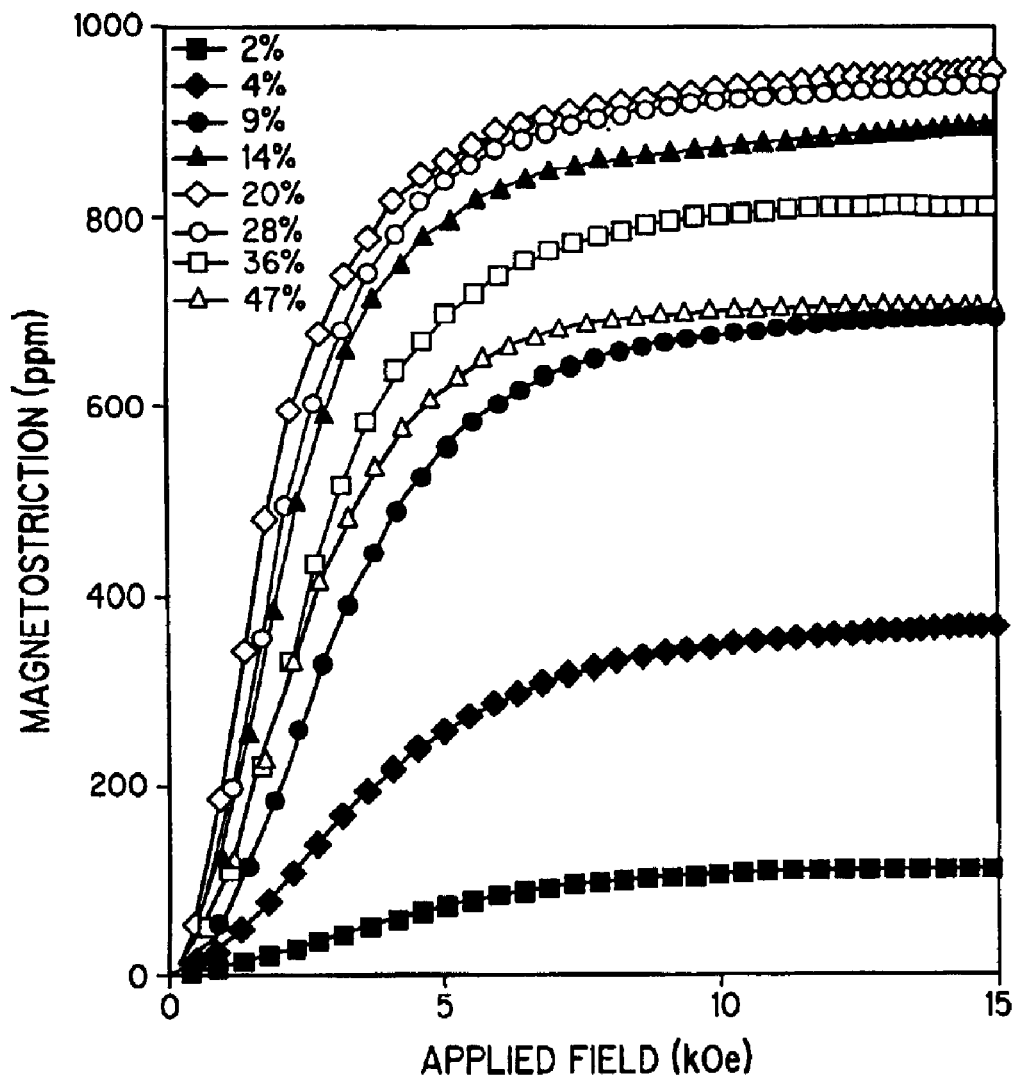
FIG. 1 is a plot of the magnetostriction of epoxy/Terfenol composites cured in the presence of a magnetic field as a function of applied magnetic field for several different Terfenol volume percentages.

The present invention provides a method for preparing flexibilized composites with large magnetostriction achieved by alignment of magnetostrictive particles along their easy magnetic axes in a resin matrix prior to and/or during the resin curing process. The composite of magnetostrictive particles in a resin system comprises a thermosetting epoxy resin that allows for the creation of a macroscopically locked in structure when the magnetostrictive particles in the liquid resin are oriented in the presence of a magnetic field during curing. The resin system further comprises silica, which prevents settling and enables dispersion of the magnetostrictive particles throughout the resin matrix. The resin system also comprises a flexiblizing agent that enhances the magnetostriction due to a "pushing" effect of the magnetostrictive particles on the flexible matrix material. An amine curing agent is used with the thermosetting epoxy resin, and is advantageously a cycloaliphatic amine, which provides high glass transition temperature and good toughness properties to the cured resin. The flexibilizing agent may be a flexibilized resin or a flexibilized curing agent. The desired degree of toughness may be accomplished by adjusting the amount of the flexibilized resin or curing agent in the composite formulation. The aligned composites made by the method of the present invention may achieve up to 90% of the magnetostriction of the pure magnetostrictive material.

The magnetostrictive material to be mixed with the resin system in the method of the present invention may be a rare-earth/iron alloy, nickel, a nickel alloy, or a cobalt/ferrite alloy. The rare-earth elements include yttrium, lanthanum, cerium, praseodymium, neodymium, samarium, gadolinium, terbium, dysprosium, holmium, erbium, thulium, ytterbium or lutetium or mixtures thereof. In an exemplary embodiment, the magnetostrictive material is an alloy of terbium, dysprosium and iron, in particular $(Tb_{0.3}Dy_{0.7})Fe_2$ known in the industry as Terfenol or Terfenol-D. The magnetostrictive material advantageously comprises particles having a size (major axis) in the range of 100–300 μm. The particles comprise 2–50% by volume of the composite, advantageously 8–50% by volume, and more advantageously 12–30% by volume.

The magnetostrictive particles are dispersed in a resin system comprising a thermosetting epoxy resin. An exemplary epoxy resin is a bisphenol-A diepoxide. An example of such a resin is RSL-1462 from the Resolution Performance Products Co., which is a bisphenol-A/epichlorohydrine-derived epoxy resin having an epoxy equivalent weight (EEW) of 180. Other bisphenol-A diepoxides may be used, and advantageously have an EEW in the range of 170–240.

Fumed silica is added to the resin system as a viscosity modifier to prevent settling of the magnetostrictive particles and to aid in uniform dispersion of the particles throughout the resin matrix. The silica is advantageously present in an amount of 0.5–5% by weight of the resin system, and more advantageously 2% by weight. An exemplary fumed silica is Cab-O-Sil® TS-720 from Cabot Corp. Other examples include any fumed silica under the Cab-O-Sil® tradename (e.g., TS-530, TS-610, EH-5 and M-5) or the Aerosil® tradename (e.g., 150, 200, OX 50, R 104 and R 202) from Degussa.

The epoxy resin is reacted or cured with an amine curing agent. An exemplary amine curing agent is a cycloaliphatic amine, such as 4,4-methylenebiscyclohexaneamine, which provides a high glass transition temperature and good toughness properties to the cured resin. A suitable cycloaliphatic amine is Ancamine® 2264 from Air Products Corp.

Resin systems with enhanced toughness and less rigidity are prepared by incorporating into the resin system a flexibilizing agent, which may be a flexible resin and/or a flexible polyamine curing agent. The desired degree of toughness and flexibility is accomplished by adjusting the amount of the flexibilized resin or curing agent in the formulation.

The flexible amine curing agents are primary amines, and are advantageously included in a stoichiometrically or near stoichiometrically equivalent concentration to that of the epoxy resin as characterized by its epoxy equivalent weight (EEW). The primary amine flexibilizing agent includes a high molecular weight polyoxypropylene diamine or triamine of molecular weight (MW) in the range of 2000–5000. Examples of suitable diamines are the amine terminated polypropylene glycols. These are diamines with the primary amine groups at the ends of a polyoxypropylene chain of suitable length. Specific examples include Jeffamine® polyoxypropylene amines having molecular weights (MW) of 2000 and 4000. Examples of polyoxypropylene triamines are propylene oxide-based triamines that are prepared by a reaction of propylene oxide with a triol initiator, such as glycerine or trimethylolpropane. The glycerine triol initiators, for example, of the polyoxypropylene triamines are available in molecular weights (MW) in the 3000–5000 range. These relatively high molecular weight (i.e., MW 2000–5000) polyoxypropylene di and tri primary amines provide flexibility to the resulting epoxy resin.

Suitable low molecular weight polyoxypropylene diamines or triamines in the molecular weight (MW) range of 230–450 may be employed in combination with the higher molecular weight group to provide a suitable flexibility and strength to the composite. Jeffamine® D400, an amine-terminated polypropylene glycol having a molecular weight (MW) of about 400 and Jeffamine® T403, a trimethylolpropane-initiated polyoxypropylene triamine having a molecular weight (MW) of about 440, are examples of suitable, relatively low molecular weight di- or triamines.

The curing of bisphenol-A-based epoxy resin with polyether amine curing agents is rather slow, even at elevated temperatures. The addition of a tertiary amine accelerator is therefore advantageous. Dimethylamino methyl phenol (DMAMP) is an effective tertiary amine-based accelerator particularly at high curing temperatures.

The flexible resins may comprise flexible diepoxides, and advantageously have an epoxy equivalent weight (EEW) of 390–470. An exemplary flexible diepoxide is the diglycidyl ester aliphatic epoxy resin Epon® 871 from the Resolution Performance Products Co, which is effective in providing flexibility and toughness to epoxy resin systems. Alternately, the flexibilizing agent may comprise a mixture of a high molecular weight polypropyleneoxide diamine or triamine of MW 2000–5000 and a low molecular weight polypropyleneoxide diamine or triamine of MW 230–450.

The composites are prepared by first mixing the components of the resin system, namely the resin, curing agent, flexibilizing agent, optional accelerator and fumed silica. Advantageously, the silica is added after first mixing the other components. Once the resin system is thoroughly mixed, the magnetostrictive particles are dispersed in the resin, such as by low speed mixing. The resulting composite paste is then cast into a mold of desired shape.

The magnetostrictive particles are then oriented in the presence of a magnetic field. A field of 2 kG is sufficient to orient the particles, though higher or lower fields may be used as desired. The particles align along their magnetic easy axes in the direction of the field, generally the <111>direction. Orientation of the particles may be performed prior to and/or during curing of the composite paste. Advantageously, the magnetostrictive particles are cured in the presence of the magnetic field, referred to as "field curing." Field curing may include an elevated temperature cure, a room temperature cure, or a room temperature cure followed by an elevated temperature cure. By way of a preferred example, curing may include an initial room temperature cure for at least about 6 hours followed by an elevated temperature cure. The magnetic field may be applied during all or a portion of the curing process.

EXAMPLE

The following is an exemplary formulation used to produce less rigid or flexibilized epoxy-Terfenol composites, wherein the concentration of each primary amine in the formulation is given as a percent of total amine curing agents, not including the accelerator:

| Material | Percent of Total Amine | Weight (g) |
|---|---|---|
| Ancamine ® 2264 (Air Products) | 40 | 5.28 |
| Jeffamine ® D400 (Huntsman Corp) | 20 | 2.64 |
| Jeffamine ® D2000 (Huntsman Corp) | 40 | 5.28 |
| DMAMP (Air Products) | | 1.25 |
| RSL-1462 Epoxy Resin (Resolution Performance Products) | | 25 |

Terfenol-epoxy formulations were prepared by thoroughly mixing the epoxy resin, curing agent, flexibilizing agents and accelerator, followed by the addition of fumed silica (Cab-O-Sil® TS-720 available from Cabot Corp.) at a concentration of 2% of the total weight of the epoxy, curing agent, flexibilizing agent and accelerator. The fumed silica is a viscosity modifier to prevent the settling of the yet-to-be-added Terfenol powder. Terfenol powder was added to the resin mixture in amounts between 0 and 50 vol. %, and low speed mixing was continued for an additional period of 10 minutes to form a uniform paste. The Terfenol particle size range of 100–300 $\mu$m was used to make the formulations. The pastes were then cast into cylindrical shaped molds made out of Teflon® and then covered with a Teflon® sheet to constrain the paste. The mold was then sandwiched between two aligned 2 kG ferrite magnets, and this assembly was left to field cure overnight at room temperature. The assembly was then placed in an air circulating oven set at 120° C., and field curing continued for a period of 3 hours.

FIG. 1 depicts the magnetostrictive coefficient versus the applied magnetic field for the Terfenol-epoxy composites field cured in the presence of the 2 kG magnetic field to align the magnetostrictive particles in the direction of the field. A rapid rise in the magnetostrictive coefficient is observed with applied field and saturation for field values less than 10 kOe. The largest magnetostrictive coefficients are observed for Terfenol content between 12–30% by volume of the composite paste. However, Terfenol contents between 8% and 50% by volume achieve greater than 50% of the magnetostrictive coefficient of bulk Terfenol. As stated above, the magnetostrictive coefficient for composites may be reduced by as much as approximately the volume fraction of the magnetostrictive phase, such that FIG. 1 demonstrates that lower Terfenol concentrations may be incorporated in the composite to achieve the same or significantly higher magnetostriction by virtue of the flexibilizing of the resin system, the uniform dispersion of the particles, and the alignment of the magnetostrictive particles by curing in the presence of a magnetic field. In a preferred aspect, the composite exhibits a magnetostrictive coefficient of at least 500 ppm under an applied field of at least 5 kOe.

Figure 2:
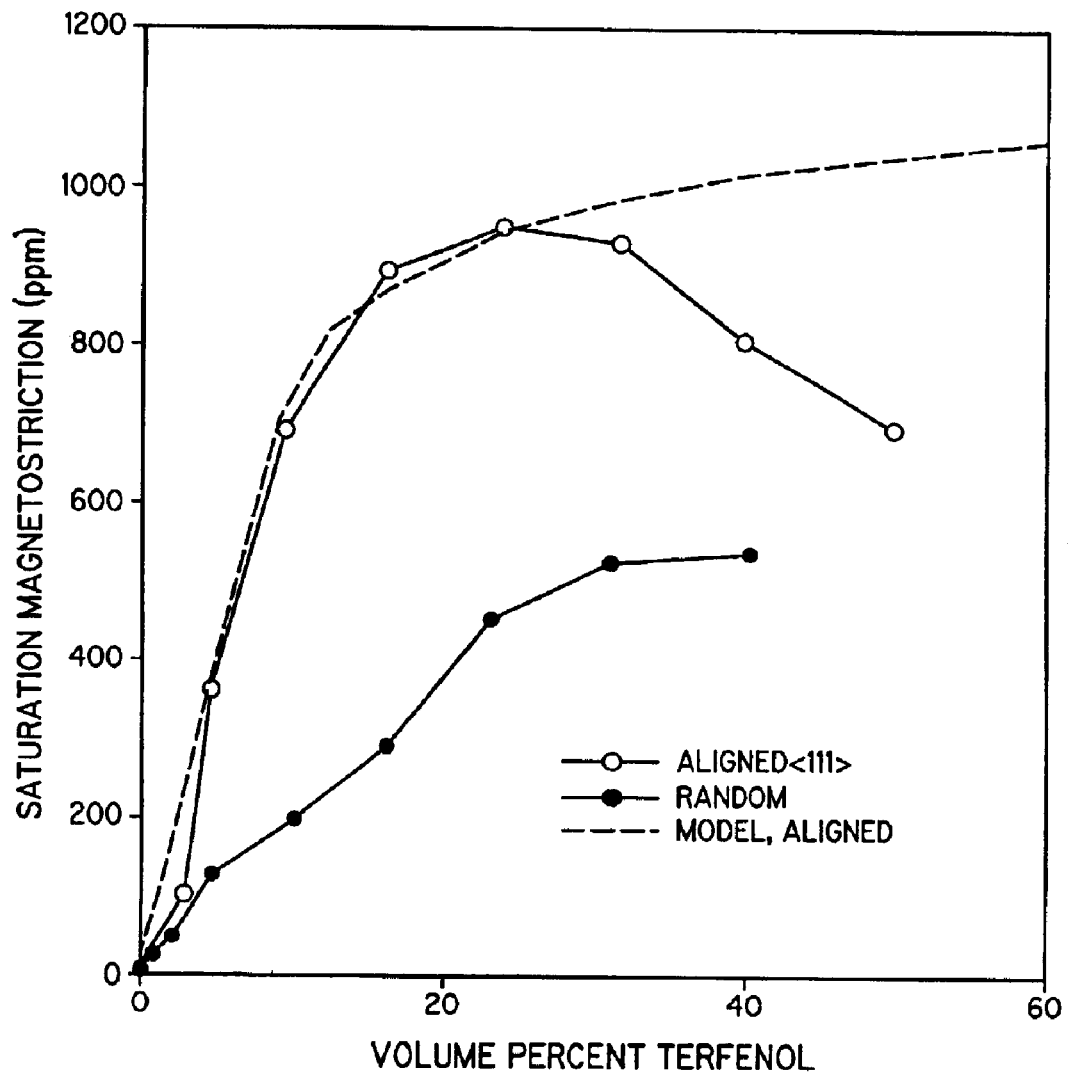
FIG. 2 is a plot of the saturation magnetostriction of Terfenol/epoxy composites with Terfenol particles randomly distributed (random) and with Terfenol particles aligned with their easy magnetic axes along the direction of applied field (aligned<111>) as a function of volume percentage of Terfenol.

FIG. 2 is a plot of the saturation magnetostriction as a function of Terfenol concentration for composites having aligned particles by curing in the presence of the magnetic field. For comparison, the magnetostrictive coefficient is also provided for the same matrix epoxy and Terfenol composites in which curing was performed without a magnetic field, such that the Terfenol particles are randomly arranged in the resin matrix. The theoretical model is also depicted. The magnetic field curing process, which causes the Terfenol particles to rotate with their magnetic easy axis, which is also an axis of large magnetostriction, in the direction of the field during the curing process, can produce significant enhancement in the magnetostrictive coefficient of the composites. In accordance with the expectations of the theoretical models, the magnetostrictive coefficient rises to a value of 90% of that for pure Terfenol even for filling fractions of less than 20% by volume. For filling fractions greater than 30%, the magnetostriction begins to decrease due to the lesser ability of the applied field during the curing process to align the Terfenol particles at the higher volume concentrations.

While the present invention has been illustrated by the description of one or more embodiments thereof, and while the embodiments have been described in considerable detail, they are not intended to restrict or in any way limit the scope of the appended claims to such detail. Additional advantages and modifications will readily appear to those skilled in the art. For example, while epoxy-Terfenol composites flexibilized by primary amine curing agents are discussed in detail, other resins, flexibilizing agents and magnetostrictive particles may be used in the formulation and method of the present invention, as set forth above. The invention in its broader aspects is therefore not limited to the specific details, representative apparatus and method and illustrative examples shown and described. Accordingly, departures may be made from such details without departing from the scope or spirit of the general inventive concept.

What is claimed is:

1. A method of making a magnetostrictive composite comprising:
   mixing 2–50 vol. % magnetostrictive particles with a resin system to form a composite paste, wherein the resin system comprises a thermosetting epoxy resin, an amine curing agent, fumed silica and a flexibilizing agent, said magnetostrictive particles having a particle size in the range of about 100–300 $\mu$m;
   orienting the magnetostrictive particles in the composite paste in the presence of a magnetic field whereby the magnetostrictive particles align in the direction of the field; and
   curing the composite paste.

2. The method of claim 1 wherein the magnetostrictive particles comprise a material selected from the group consisting of: a rare-earth/iron alloy, nickel, a nickel alloy, and a cobalt/ferrite alloy.

3. The method of claim 1 wherein the magnetostrictive particles comprise an alloy of iron, terbium and dysprosium.

4. The method of claim 1 wherein the magnetostrictive particles comprise between 12–30 vol. % of the composite paste.

5. The method of claim 1 wherein the fumed silica comprises 0.5–5 wt. % of the composite paste.

6. The method of claim 1 wherein mixing includes first mixing the thermosetting epoxy resin, flexibilizing agent and curing agent, then mixing in the fumed silica, and then mixing in the magnetostrictive particles.

7. The method of claim 1 wherein the thermosetting epoxy resin is a bisphenol-A diepoxide.

8. The method of claim 1 wherein the curing agent is a cycloaliphatic amine.

9. The method of claim 1 wherein the flexibilizing agent comprises a flexible diepoxide.

10. The method of claim 9 wherein the flexibilizing agent has an EEW of 390–470.

11. The method of claim 10 wherein the flexibilizing agent is a diglycidyl ester aliphatic epoxy resin.

12. The method of claim 1 wherein the flexibilizing agent comprises a high molecular weight polyamine of MW 2000–5000.

13. The method of claim 1 wherein the flexibilizing agent comprises a mixture of a high molecular weight polypropyleneoxide diamine or triamine of MW 2000–5000 and a low molecular weight polypropyleneoxide diamine or triamine of MW 230–450.

14. The method of claim 13 wherein the resin system further comprises a tertiary amine accelerator.

15. The method of claim 1 wherein the resin system further comprises a dimethylamino methyl phenol accelerator.

16. The method of claim 1 wherein curing includes an initial room temperature cure for at least about 6 hours followed by an elevated temperature cure.

17. The method of claim 1 wherein the curing is performed in the presence of the magnetic field whereby the orienting occurs during the curing.

18. The method of claim 17 wherein the curing in the presence of the magnetic field is performed at an elevated temperature.

19. The method of claim 17 wherein the curing in the presence of the magnetic field is performed at room temperature.

20. A method of making a magnetostrictive composite comprising:
mixing an epoxy resin, fumed silica, a flexibilizing agent and a cycloaliphatic amine curing agent to form a resin mixture, wherein the flexibilizing agent is a flexible diepoxide of EEW 390–470 or a mixture of a high molecular weight polyamine of MW 2000–5000 and a low molecular weight polyamine of MW 230–450;
mixing 2–50 vol. % magnetostrictive particles into the resin mixture to form a composite paste; and
curing the composite paste in the presence of a magnetic field whereby the magnetostrictive particles align in the direction of the field during curing.

21. The method of claim 20 wherein the magnetostrictive particles comprise between 12–30 vol. % of the composite paste.

22. The method of claim 21 wherein the fumed silica is present in an amount of 0.5–5 wt. % of the resin mixture.

23. The method of claim 20 wherein the magnetostrictive particles comprise a material selected from the group consisting of: a rare-earth/iron alloy, nickel, a nickel alloy, and a cobalt/ferrite alloy.

24. The method of claim 20 wherein the magnetostrictive particles comprise an alloy of iron, terbium and dysprosium.

25. The method of claim 20 wherein the magnetostrictive particles have a particle size in the range of about 100–300 $\mu$m.

26. The method of claim 20 wherein the epoxy resin is a bisphenol-A diepoxide.

27. The method of claim 20 wherein the resin mixture further comprises a tertiary amine accelerator.

28. The method of claim 20 wherein curing includes an initial room temperature cure for at least about 6 hours followed by an elevated temperature cure.

29. A method of making a magnetostrictive composite comprising:
mixing a bisphenol-A diepoxide resin, fumed silica, a cycloaliphatic amine curing agent, a high molecular weight polypropyleneoxide diamine or triamine of MW 2000–5000, a low molecular weight polypropyleneoxide diamine or triamine of MW 230–450 and a tertiary amine accelerator to form a resin mixture;
mixing 8–50 vol. % magnetostrictive particles comprising an alloy of iron, terbium and dysprosium into the resin mixture to form a composite paste; and
curing the composite paste in the presence of a magnetic field whereby the magnetostrictive particles align in the direction of the field during curing.

30. The method of claim 29 wherein the magnetostrictive particles have a particle size in the range of about 100–300 $\mu$m.

31. The method of claim 29 wherein the magnetostrictive particles comprise between 12–30 vol. % of the composite paste.

32. The method of claim 29 wherein the fumed silica comprises 0.5–5 wt. % of the composite paste.

33. The method of claim 29 wherein curing includes an initial room temperature cure for at least about 6 hours followed by an elevated temperature cure.

34. A magnetostrictive composite comprising:
50–98 vol. % resin matrix comprising a cured form of a thermosetting epoxy resin, an amine curing agent, fumed silica and a flexibilizing agent; and
2–50 vol. % magnetostrictive particles dispersed throughout the resin matrix and oriented in the direction of their magnetic easy axes, said magnetostrictive particles having a particle size in the range of about 100–300 $\mu$m.

35. The magnetostrictive composite of claim 34 wherein the magnetostrictive particles comprise a material selected from the group consisting of: a rare-earth/iron alloy, nickel, a nickel alloy, and a cobalt/ferrite alloy.

36. The magnetostrictive composite of claim 34 wherein the magnetostrictive particles comprise an alloy of iron, terbium and dysprosium.

37. The magnetostrictive composite of claim 34 wherein the composite comprises 12–30 vol. % magnetostrictive particles.

38. The magnetostrictive composite of claim 34 wherein the resin matrix comprises 0.5–5 wt. % of the fumed silica.

39. The magnetostrictive composite of claim 34 wherein the resin matrix comprises the flexibilizing agent as a high molecular weight polyamine of MW 2000–5000.

40. The magnetostrictive composite of claim 34 wherein the resin matrix comprises the flexibilizing agent as a mixture of a high molecular weight polypropyleneoxide diamine or triamine of MW 2000–5000 and a low molecular weight polypropyleneoxide diamine or triamine of MW 230–450.

41. The magnetostrictive composite of claim 34 wherein the resin matrix comprises the flexibilizing agent as a flexible diepoxide of EEW 390–470.

42. The magnetostrictive composite of claim 41 wherein the resin matrix comprises the flexibilizing agent as a diglycidyl ester aliphatic epoxy resin.

43. The magnetostrictive composite of claim 34 wherein the thermosetting resin is a bisphenol-A diepoxide.

44. The magnetostrictive composite of claim 34 wherein the resin matrix comprises the curing agent as a cycloaliphatic amine.

45. A magnetostrictive composite comprising:
50–98 vol. % resin matrix comprising a cured form of an epoxy resin, fumed silica, a cycloaliphatic amine curing agent, and a flexibilizing agent that is a flexible diepoxide of EEW 390–470 or a mixture of a high molecular weight polyamine of MW 2000–5000 and a low molecular weight polyamine of MW 230–450; and
2–50 vol. % magnetostrictive particles dispersed throughout the resin matrix and oriented in the direction of their magnetic easy axes.

46. The magnetostrictive composite of claim 45 wherein the magnetostrictive particles comprise a material selected from the group consisting of: a rare-earth/iron alloy, nickel, a nickel alloy, and a cobalt/ferrite alloy.

47. The magnetostrictive composite of claim 45 wherein the magnetostrictive particles comprise an alloy of iron, terbium and dysprosium.

48. The magnetostrictive composite of claim 45 wherein the magnetostrictive particles have a particle size in the range of about 100–300 $\mu$m.

49. The magnetostrictive composite of claim 45 wherein the composite comprises 12–30 vol. % magnetostrictive particles.

50. The magnetostrictive composite of claim 45 wherein the resin matrix results from curing the composite paste comprising 0.5–5 wt. % of the fumed silica.

51. A magnetostrictive composite comprising:
50–92 vol. % resin matrix resulting from curing a composite paste comprising a cured form of a bisphenol-A diepoxide resin, fumed silica, a cycloaliphatic amine curing agent, a high molecular weight polypropyleneoxide diamine or triamine of MW 2000–5000, a low molecular weight polypropyleneoxide diamine or triamine of MW 230–450 and a tertiary amine accelerator; and 8–50 vol. % magnetostrictive particles comprising an alloy of iron, terbium and dysprosium dispersed throughout the resin matrix and oriented in the direction of their magnetic easy axes, wherein the composite exhibits a magnetostrictive coefficient of at least 500 ppm under an applied field of at least 5 kOe.

* * * * *